(12) United States Patent
Kohama (10) Patent No.: US 8,866,067 B2
(45) Date of Patent: Oct. 21, 2014

(54) IMAGING DEVICE WITH AN IMAGING ELEMENT AND AN ELECTRONIC COMPONENT

(75) Inventor: Kenichi Kohama, Satsumasendai (JP)

(73) Assignee: Kyocera Corporation, Kyoto (JP)

( * ) Notice: Subject to any disclaimer, the term of this patent is extended or adjusted under 35 U.S.C. 154(b) by 261 days.

(21) Appl. No.: 13/375,458

(22) PCT Filed: Dec. 24, 2010

(86) PCT No.: PCT/JP2010/073404
§ 371 (c)(1),
(2), (4) Date: Mar. 12, 2012

(87) PCT Pub. No.: WO2011/078350
PCT Pub. Date: Jun. 30, 2011

(65) Prior Publication Data
US 2012/0248294 A1 Oct. 4, 2012

(30) Foreign Application Priority Data
Dec. 24, 2009 (JP) ................. 2009-292206

(51) Int. Cl.
*H01J 5/02* (2006.01)
*H04N 5/225* (2006.01)
*H01L 27/146* (2006.01)

(52) U.S. Cl.
CPC ........... *H04N 5/2253* (2013.01); *H04N 5/2254* (2013.01); *H04N 5/2257* (2013.01); *H01L 27/14618* (2013.01)
USPC ......................................................... 250/239

(58) Field of Classification Search
USPC .................... 250/239; 348/340; 257/432–434
See application file for complete search history.

(56) References Cited

U.S. PATENT DOCUMENTS

| 8,049,809 | B2 | 11/2011 | Yamamoto |
| 2005/0169620 | A1 | 8/2005 | Minamio et al. |

(Continued)

FOREIGN PATENT DOCUMENTS

| CN | 101536489 A | 9/2009 |
| JP | 0271982 U | 5/1990 |

(Continued)

OTHER PUBLICATIONS

Chinese language office action dated Jan. 6, 2014 and its English language concise explanation issued in corresponding Chinese application 201080023957.8.

(Continued)

*Primary Examiner* — Thanh Luu
(74) *Attorney, Agent, or Firm* — DLA Piper LLP (US)

(57) ABSTRACT

An imaging device includes a circuit board having a wiring line formed as part of an upper surface thereof; an electronic component mounted on the circuit board; a frame body mounted on the circuit board so as to surround the electronic component, and having connection electrodes formed on or above an upper surface thereof and external terminals formed on or above at least one of a side surface and a lower surface thereof which are electrically connected to the connection electrodes; an imaging element having a light-receiving section located in a central portion of an upper surface thereof, the imaging element being mounted on the upper surface of the frame body so as to cover an opening of the frame body; and a lens barrel having a lens, which is bonded to an outer periphery of the upper surface of the frame body so as to cover the imaging element.

15 Claims, 10 Drawing Sheets

(56) References Cited

U.S. PATENT DOCUMENTS

2006/0289733 A1* 12/2006 Zung et al. .................... 250/239
2007/0236596 A1* 10/2007 Sekine et al. ................. 348/340
2009/0002829 A1 1/2009 Shinohara
2009/0213254 A1 8/2009 Yamamoto
2009/0294779 A1 12/2009 Ida et al.

FOREIGN PATENT DOCUMENTS

| JP | 2002299592 A | 10/2002 |
| JP | 2004335533 A | 11/2004 |
| JP | 2008258793 A | 10/2008 |

OTHER PUBLICATIONS

Extended European search report dated Dec. 2, 2013 issued in corresponding European application 10839579.9.
International search report dated Feb. 1, 2011 issued in corresponding PCT application PCT/JP2010/073404.

* cited by examiner

IMAGING DEVICE WITH AN IMAGING ELEMENT AND AN ELECTRONIC COMPONENT

CROSS-REFERENCE TO THE RELATED APPLICATIONS

This application is a national stage of international application No. PCT/JP2010/073404, filed on Dec. 24, 2010, and claims the benefit of priority under 35 USC 119 to Japanese Patent Application No. 2009-292206, filed on Dec. 24, 2009, the entire contents of which are incorporated herein by reference.

TECHNICAL FIELD

The present invention relates to an imaging device which employs an imaging element of CCD (Charge Coupled Device) type or CMOS (Complementary Metal Oxide Semiconductor) type for example.

BACKGROUND ART

There is a heretofore known imaging device applicable to a digital camera, an optical sensor, and so forth, which is constructed by mounting an imaging element e.g. of CCD type or CMOS type on a wiring board. In such an imaging device, for example, an imaging element is mounted on a wiring board, and a lens is disposed above the imaging element by a lens securing member, so that the imaging element and the lens can be sealed by the lens securing member. Moreover, electronic components including a capacitor and a resistor are installed around the imaging element. The imaging device is designed to convert light (image) inputted to a light-receiving section of the imaging element mounted on the wiring board into an electric signal by the imaging element, and output a converted signal to an external circuit or the like within a digital camera via a connecting member such for example as a bonding wire, a wiring conductor of the wiring board, and an external terminal.

In one of known examples of such an imaging device (refer to Patent Literature 1, for example), in the interest of area reduction in the imaging device for miniaturization, a recess is formed at an upper surface of a wiring board, and an imaging element is disposed on the upper surface of the wiring board so as to cover the recess. Moreover, a plurality of electronic components including an IC, a capacitor, a coil, and a resistor for processing electric signals from the imaging element are mounted on the bottom of the recess. In another known example of the imaging device (refer to Patent Literature 2, for example), a recess is formed at a lower surface of a wiring board, and a plurality of electronic components including an IC, a capacitor, a coil, and a resistor for processing electric signals from an imaging element are mounted inside the recess.

A wiring board such as adopted in those imaging devices is made of an insulating material such as ceramics or resin. For example, in the case of using ceramics, the wiring board can be fabricated by laminating a plurality of ceramic green sheets of predetermined configuration on top of each other and then firing the resultant stacked body. In keeping up with the recent trend toward low-profile imaging devices, the recess formed in the wiring board has a bottom thickness in a range of about 0.3 mm to 0.4 mm, and has a depth in a range of about 0.3 mm to 0.4 mm. That is, the constituent ceramic green sheets are very small in thickness.

CITATION LIST

Patent Literature

Patent Literature 1: Japanese Unexamined Patent Publication JP-A 2008-258793
Patent Literature 2: Japanese Unexamined Patent Publication JP-A 2004-335533

SUMMARY OF INVENTION

Technical Problem

However, in recent years, further slimming-down has come to be increasingly demanded of imaging devices for use in electronic equipment such as cellular phones and digital cameras. In order to meet the demand, in an imaging device of the type that incorporates a plurality of electronic components including an IC, a capacitor, a coil, and a resistor for processing electric signals from an imaging element that are mounted in a recess formed in a wiring board, the imaging device is made lower in profile by decreasing the bottom thickness of the recess. To date, the bottom thickness of the recess has been reduced to very low values ranging from about 0.3 mm to 0.4 mm, wherefore an additional reduction in the bottom thickness could lead to further deterioration in mechanical strength of the wiring board. After all, the imaging device is subjected to breakage when a force is applied to the bottom of the recess due to the placement of the imaging element or electronic component. Furthermore, in the case where the wiring board is made of ceramics, and more specifically composed of stacked ceramic green sheets, an attempt to reduce the bottom thickness of the recess makes it difficult to form ceramic green sheets constituting the bottom of the recess. Furthermore, because of the influence of shrinkage resulting from firing process, the recess does not have a flat bottom; that is, the bottom of the recess has surface irregularities ranging in dimension from 0.05 mm to 0.1 mm. Therefore, in the case where a recess for mounting electronic components is formed on the lower surface of the wiring board, and the imaging element is mounted on the upper surface thereof, the imaging element stands in a tilted position. This makes it impossible to implement an imaging device for producing output of high-quality image signals. In addition, in the case where electronic components are mounted on the bottom of the recess formed at the upper surface of the wiring board, the electronic components cannot be mounted properly. This leads to improper mount, for example, the area of junction between an electrode of the electronic component and a wiring line on the wiring board is so narrow that the resistance at the junction is increased, or the electrode of the electronic component and the wiring line on the wiring board cannot be bonded to each other. In order to avoid such problems, the recess needs to be configured to have a bottom thickness large enough to prevent development of irregularities. This renders further slimming-down of the imaging device impossible.

Furthermore, in the imaging device, the distance between the light-receiving section of the imaging element and the lens is determined according to a focal length of the lens. It is therefore difficult to make the imaging device lower in profile for example by decreasing the height of the lens barrel for the shortening of the distance between the lens and the light-receiving section of the imaging element.

The invention has been devised in view of the problems associated with the conventional art as mentioned above, and accordingly an object thereof is to provide an imaging device including an imaging element and an electronic component, which can be made lower in profile and smaller in size, and is capable of producing output of high-quality image signals.

Solution to Problem

The invention provides an imaging device, including: a circuit board having a wiring line formed as part of an upper surface thereof; an electronic component mounted on the circuit board; a frame body mounted on the circuit board so as to surround the electronic component, the frame body having a plurality of connection electrodes formed on or above an upper surface thereof and a plurality of external terminals formed on or above at least one of a side surface and a lower surface thereof which are electrically connected to the connection electrodes; an imaging element having a light-receiving section located in a central portion of an upper surface thereof, the imaging element being mounted on the upper surface of the frame body so as to cover an opening of the frame body; and a lens barrel having a lens, the lens barrel being bonded to an outer periphery of the upper surface of the frame body so as to cover the imaging element.

Advantageous Effects of Invention

The imaging device of the invention includes a circuit board having a wiring line formed as part of an upper surface thereof; an electronic component mounted on the circuit board; a frame body mounted on the circuit board so as to surround the electronic component, the frame body having a plurality of connection electrodes formed on or above an upper surface thereof and a plurality of external terminals formed on or above at least one of a side surface and a lower surface thereof which are electrically connected to the connection electrodes; an imaging element having a light-receiving section located in a central portion of an upper surface thereof, the imaging element being mounted on the upper surface of the frame body so as to cover an opening of the frame body; and a lens barrel having a lens, the lens barrel being bonded to an outer periphery of the upper surface of the frame body so as to cover the imaging element. Accordingly, in this construction, in contrast to a conventional-type imaging device, there is no portion corresponding to the bottom of the recess of the wiring board. That is, breakage of the bottom of the recess that is associated with the conventional imaging device will not take place, wherefore the imaging device as a whole can be slimmed down to an extent that is equivalent to the bottom thickness of the recess. Moreover, since the imaging element is mounted on the upper surface of the frame body and the electronic component is mounted on the circuit board so as to be surrounded by the frame body, there is no need to increase the area of the frame body, as well as the area of the circuit board, for the sake of securing a space for mounting the electronic component on the upper surface of the frame body. This makes it possible to avoid an undesirable increase in area of the imaging device in a plan view, and thereby render the imaging device lower in profile and smaller in size than ever.

Moreover, the electronic component is mounted on the circuit board, and the imaging element is mounted on the upper surface of the frame body. Accordingly, at the time of mounting the electronic component and the imaging element, it never occurs that, as seen in the conventional imaging device, the imaging element is mounted in a tilted position under the influence of deformation of the bottom of the recess, and the electronic component is mounted improperly. In consequence, the imaging device becomes capable of producing output of high-quality image signals.

DESCRIPTION OF EMBODIMENTS

Now, an imaging device pursuant to the invention will be described with reference to the accompanying drawings. In FIGS. 1 to 10, reference numeral 1 represents a circuit board, reference numeral 2 represents a wiring line, reference numeral 3 represents an electronic component, reference numeral 4 represents a frame body, reference numeral 4a represents a wall, reference numeral 5 represents a connection electrode, reference numeral 6 represents an external terminal, reference numeral 7 represents a wiring conductor, reference numeral 8 represents an imaging element, reference numeral 8a represents a light-receiving section, reference numeral 8b represents a signal processing circuit, reference numeral 8c represents an electrode, reference numeral 9 represents a lens, reference numeral 10 represents a lens barrel, reference numeral 11 represents a connecting member, reference numeral 12 represents a bonding member, and reference numeral 13 represents a light-transmittable plate.

Figure 1:
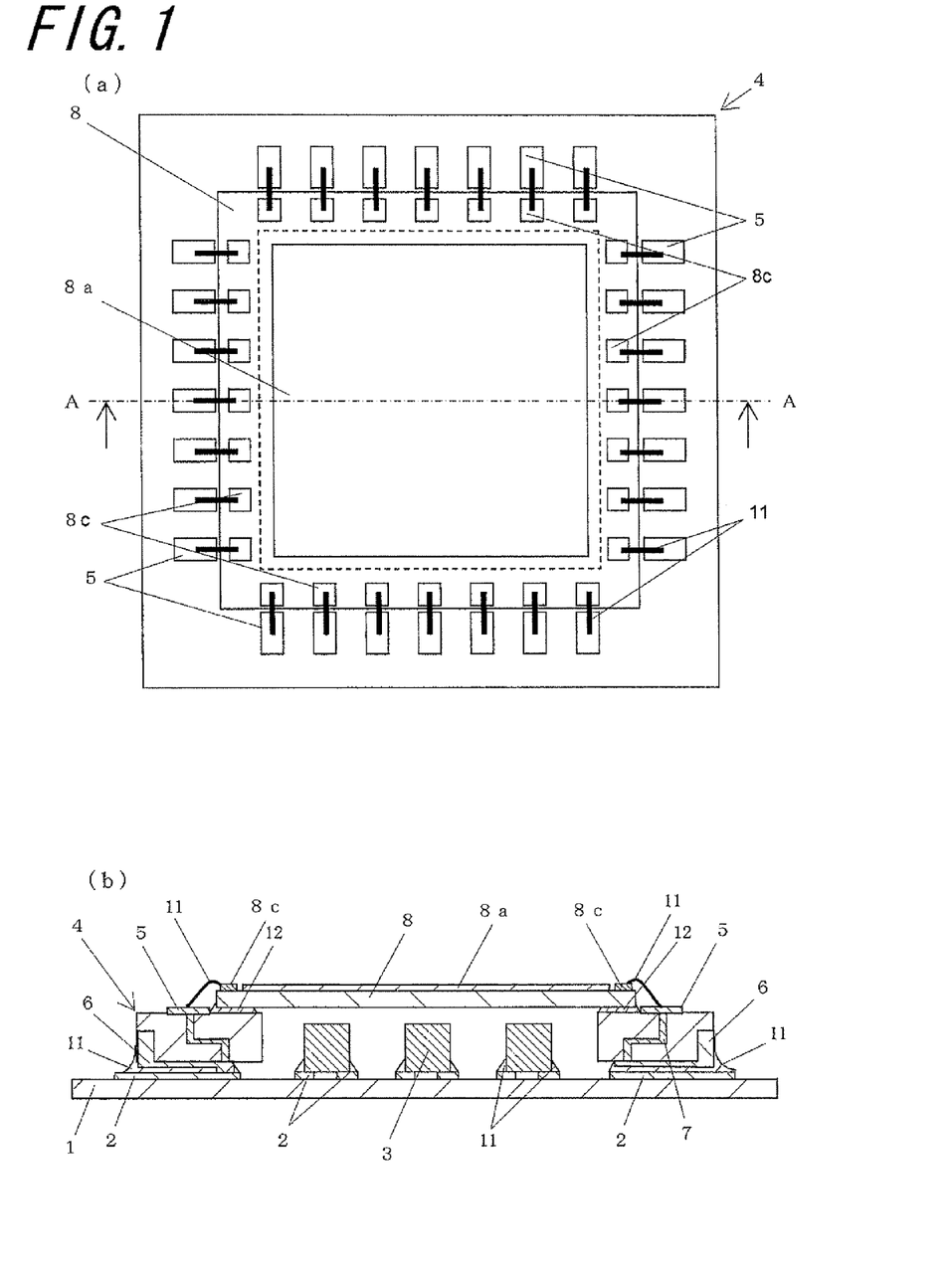
FIG. 1(a) is a top view showing an example of an imaging device according to an embodiment of the invention, with a lens barrel having a lens removed.
FIG. 1(b) is a sectional view taken along the line A-A of FIG. 1(a)
Figure 2:
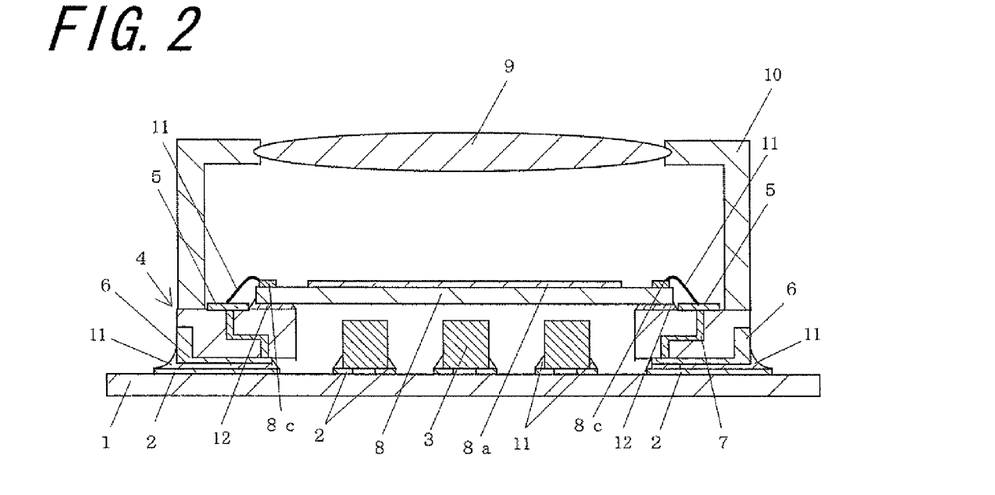
FIG. 2 is a sectional view showing an example of the imaging device according to the embodiment of the invention.

As in an example shown in the sectional view of FIG. 2, the imaging device of the invention includes: a circuit board 1 having a wiring line 2 formed as part of an upper surface thereof; an electronic component 3 mounted on the circuit board 1; a frame body 4 mounted on the circuit board 1 so as to surround the electronic component 3, the frame body having a plurality of connection electrodes 5 formed on or above an upper surface thereof and a plurality of external terminals 6 formed on or above at least one of a side surface and a lower surface thereof which are electrically connected with the connection electrodes 5; an imaging element 8 having a light-receiving section 8a located in a central portion of an upper surface thereof, the imaging element being mounted on the upper surface of the frame body 4 so as to cover an opening of the frame body 4; and a lens barrel 10 having a lens 9, is the lens barrel being bonded to an outer periphery of the upper surface of the frame body 4 so as to cover the imaging element 8.

Here, the imaging element 8 is mounted on the upper surface of the frame body 4 so as to cover the opening of the frame body 4 via the bonding member 12 made of resin or the like, the bonding member being formed so as to extend throughout the outer periphery of the opening of the frame body 4. Connection terminals of the imaging element 8 and the plurality of connection electrodes 5 formed on or above the upper surface of the frame body 4 are connected to each other via the connecting members 11 made of a bonding wire.

According to such an imaging device of the invention, in contrast to the conventional-type imaging device, there is no portion corresponding to the bottom of the recess of the wiring board. That is, the imaging device as a whole can be slimmed down to an extent that is equivalent to the thickness of the recess formed in the wiring board. Moreover, since the imaging element 8 is mounted on the upper surface of the frame body 4 and the electronic component 3 is mounted on the circuit board 1 so as to be surrounded by the frame body 4, there is no need to increase the area of the frame body 4, as well as the area of the circuit board 1, for the sake of securing a space for the installation of the electronic component 3 on the upper surface of the frame body 4. This makes it possible to avoid an undesirable increase in area of the imaging device in a plan view, and thereby render the imaging device lower in profile and smaller in size than ever.

Moreover, the electronic component 3 is mounted on the circuit board 1, and the imaging element 8 is mounted on the upper surface of the frame body 4. Accordingly, at the time of mounting the electronic component 3 and the imaging element 8, it never occurs that, as seen in the conventional-type imaging device, the imaging element 8 is mounted in a tilted position under the influence of deformation of the bottom of the recess, and the electronic component 3 is mounted improperly. In consequence, the imaging device becomes capable of producing output of high-quality image signals.

In an example as shown in the top view of FIG. 1(a) and in the sectional view of FIG. 1(b), the frame body 4 has a rectangular-shaped opening, and the rectangular-shaped imaging element 8 is located so as to cover the opening of the frame body 4. The frame body 4 and the imaging element 8 are bonded by the bonding member 12. The imaging element 8 and the connection electrode 5 formed on or above the upper surface of the frame body 4 are electrically connected to each other by the connecting member 11 made of a bonding wire. Thereby, the imaging element 8 can be mounted on the frame body 4. Moreover, the electronic component 3 is located on the circuit board 1 so as to lie inside the opening of the frame body 4, and is electrically connected to the wiring line 2 on the circuit board. Thereby, the electronic component 3 can be mounted on the circuit board 1.

In FIG. 2, there is shown an example of the imaging device in which the lens barrel 10 having the lens 9 is disposed on the upper surface of the frame body 4 of the example shown in FIGS. 1(a) and 1(b).

Figure 3:
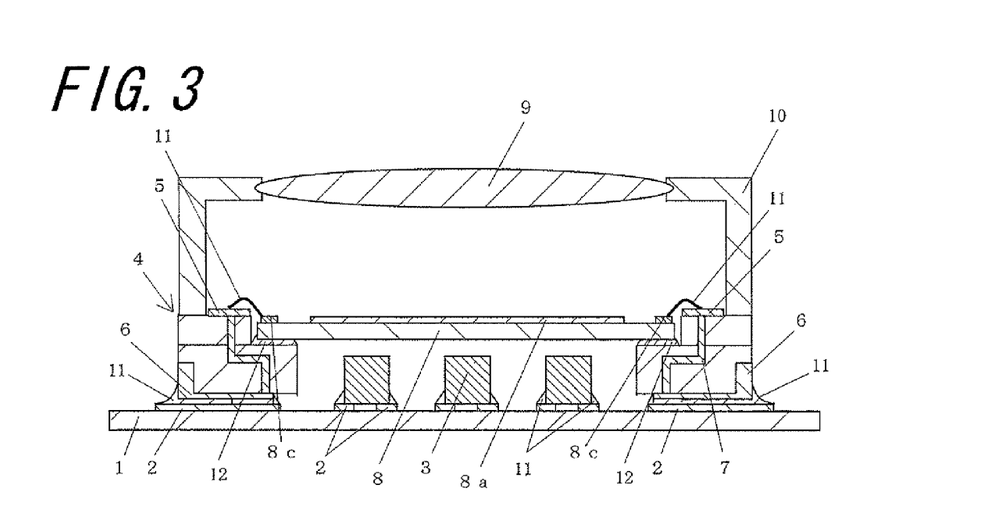
FIG. 3 is a sectional view showing another example of the imaging device according to the embodiment of the invention.

Moreover, as in an example shown in the sectional view of FIG. 3 like FIG. 2, it is advisable that the frame body 4 is configured to have a stepped upper surface to provide a shoulder which is 0.2 mm to 0.3 mm lower in level than the top and located toward the opening, and that the imaging element 8 is located on the opening side of the upper surface of the shoulder of the frame body 4, so that it can be bonded to the upper surface of the frame body 4 via the bonding member 14. In this case, by the connecting member 11 made of a bonding wire, electrical connection is established between the imaging element 8 and the plurality of connection electrodes 5 formed on or above that part of the upper surface of the frame body 4 which is higher in level than the shoulder part bonded with the imaging element 8, whereby the imaging element 8 is mounted on the frame body 4. Then, the lens barrel 10 having the lens 9 is located and bonded at the outer periphery of the upper surface of the frame body 4. In this way, the imaging device is fabricated. In such an imaging device, there is a difference in level between the surface to which the imaging element 8 is bonded and the surface on which the connection electrodes 5 are located. Since the surface on which the connection electrodes 5 are located is higher in level, it follows that the bonding member 12 in a yet-to-be cured state is caused to flow onto the connection electrodes 5, wherefore a failure of electrical connection between the imaging element 8 and the connection electrodes 5 can be prevented. This makes it possible to arrange the bonding member 12 and the connection electrode 5 close to each other, and thereby gain the advantage of being able to render the imaging device compact. Moreover, even if an electrically conductive material such for example as solder is used as the bonding member 12, it is possible to prevent occurrence of electrical short-circuiting between the connection electrodes 5 attributable to the bonding member 12.

Figure 4:
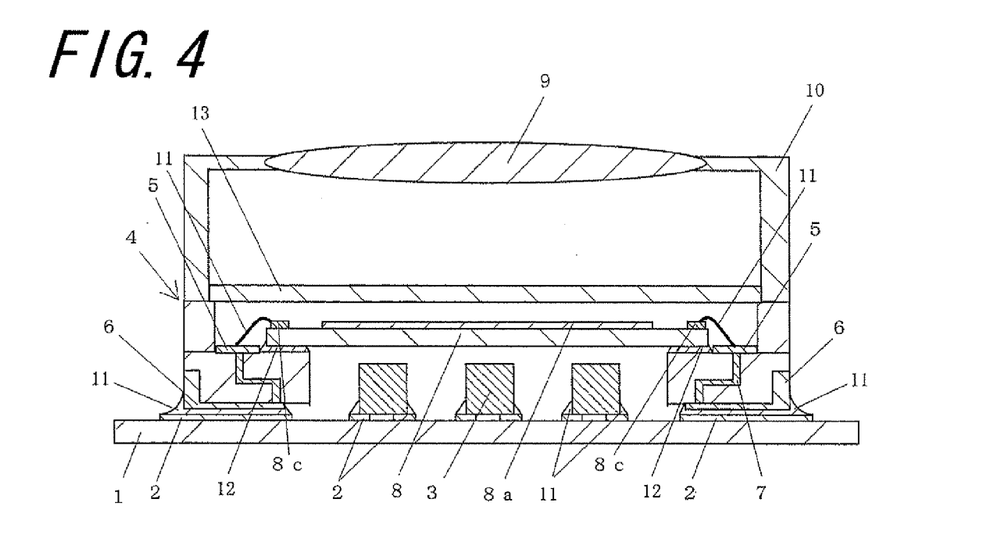
FIG. 4 is a sectional view showing another example of the imaging device according to the embodiment of the invention.

Further, as in an example shown in the sectional view of FIG. 4 like FIGS. 2 and 3, it is advisable that the frame body 4 is configured to have a stepped upper surface to provide a shoulder which is 0.2 mm to 0.3 mm lower in level than the top and located toward the opening, that the imaging element 8 is located on the opening side of the upper surface of the shoulder of the frame body 4, so that it can be bonded to the upper surface of the frame body 4 via the bonding member 14, and that the light-transmittable plate 13 is located on that part of the upper surface of the frame body 4 which is higher in level than the surface to which the imaging element 8 is bonded. In this case, by the connecting member 11 made of a bonding wire, electrical connection is established between the imaging element 8 and the plurality of connection electrodes 5 formed at the outer periphery of the upper surface of the frame body 4 to which the imaging element 8 is bonded, whereby the imaging element 8 is mounted on the frame body 4. The light-receiving section 8a of the imaging element 8 is sealed with the light-transmittable plate 13, and the lens barrel 10 having the lens 9 is disposed so that the lens 9 is located above the light-transmittable plate 13. In this way, there is obtained the imaging device in which the lens barrel 10 is bonded around the light-transmittable plate 13. In such a case, a low-pass filter or IR cutoff filter as will hereafter be described may be formed on the light-transmittable plate 13. Moreover, since the light-receiving section 8a of the imaging element 8 and the light-transmittable plate 13 are sealed by the bonding member 12, it is possible to protect the light-receiving section 8a of the imaging device 8. Further, even if changes in atmospheric pressure take place due to temperature variation in the external environment, since the space by the side of the imaging element 8 sealed with the light-transmittable plate 13 is smaller in volume capacity than the space sealed solely with the lens barrel 10 having the lens 9, it follows that, in contrast to the case where the imaging element 8 is sealed solely with the lens barrel 10 having the lens 9, the imaging element 8 can be protected against deformation even under a pressure resulting from a difference in atmospheric pressure caused between the sealed space and the exterior space.

Moreover, in the examples shown in FIGS. 1 to 10, a bonding wire is used as the connecting member 11 for establishing electrical connection between the imaging element 8 and the connection electrode 5. Alternatively, the imaging element 8 and the connection electrode 5 may be electrically connected to each other by means of solder bonding, ultrasonic bonding using Au bump, or bonding using anisotropic conductive resin. In this case, the imaging element 8 and the connection electrode 5 are positioned in overlapping relation in a plan view. This makes it possible to reduce the area of the imaging device in a plan view, and thereby gain the advantage of being able to render the imaging device compact.

Moreover, as in examples shown in FIGS. 5 to 9, in the imaging device of the invention, it is advisable that there is provided a wall 4a configured to pass over the mid-portion of the opening of the frame body 4 to divide the opening in a plan view. In this case, the frame body 4 is restrained from becoming deformed even under a thermal stress or mechanical stress. This makes it possible to protect the imaging element 8 mounted on the upper surface of the frame body 4 against deformation. Note that the "mid-portion" is part of the opening ranging from the opening center to a location spaced a distance of about a quarter of the opening length away from the opening edge, in a plan view.

Moreover, as in an example shown in FIG. 7(a), in the imaging device of the invention, it is advisable that the upper surface of the wall 4a comes in contact with the lower surface of the imaging element 8. In this case, the imaging element 8 mounted on the upper surface of the frame body 4 is restrained from becoming deformed so that it is curved convexly in a direction toward the opening, and also heat generated in the imaging element 8 is readily transmitted to the frame body 4. This makes it possible to suppress heat-induced deformation of the light-receiving section 8a of the imaging element 8. At this time, the upper surface of the wall 4a and the lower surface of the imaging element 8 may be brought into contact with each other with the bonding member 12 interposed therebetween. In this case, the imaging element 8 is restrained from becoming deformed so that it is curved convexly in a direction opposite to the opening. It is desirable to use resin containing a metal or the like having high thermal conductivity or a metal paste for the bonding member 12, because the use of such a material makes it possible to facilitate transmission of heat generated in the imaging element 8 to the frame body 4, and thereby suppress heat-induced deformation of the light-receiving section 8a of the imaging element 8.

Moreover, as in an example shown in FIG. 7(b), in the imaging device of the invention, it is advisable that the wall 4a is positioned in non-overlapping relation with the electronic component 3 in a plan view and kept out of contact with the connecting member 11 which connects the side surface of the electronic component 3 with the wiring line 2 formed as part of the upper surface of the circuit board 1. In this case, since the wall 4a is situated above the connecting member 11, it is possible to decrease the distance between the wiring lines 2 each bonded with the electronic component 3 arranged next to each other in a plan view, and thereby reduce the size of the imaging device in a plan view. In the case of locating the wall 4a between the connecting members 11, to avoid contact with the connecting members 11, the wall 4a may be narrowed at its part facing the connecting member 11, or the wall 4a may have a notch formed at its part facing the connecting member 11. This makes it possible to reduce the size of the imaging device in a plan view without the necessity of decreasing the area of the upper surface of the wall 4a.

Figure 8:
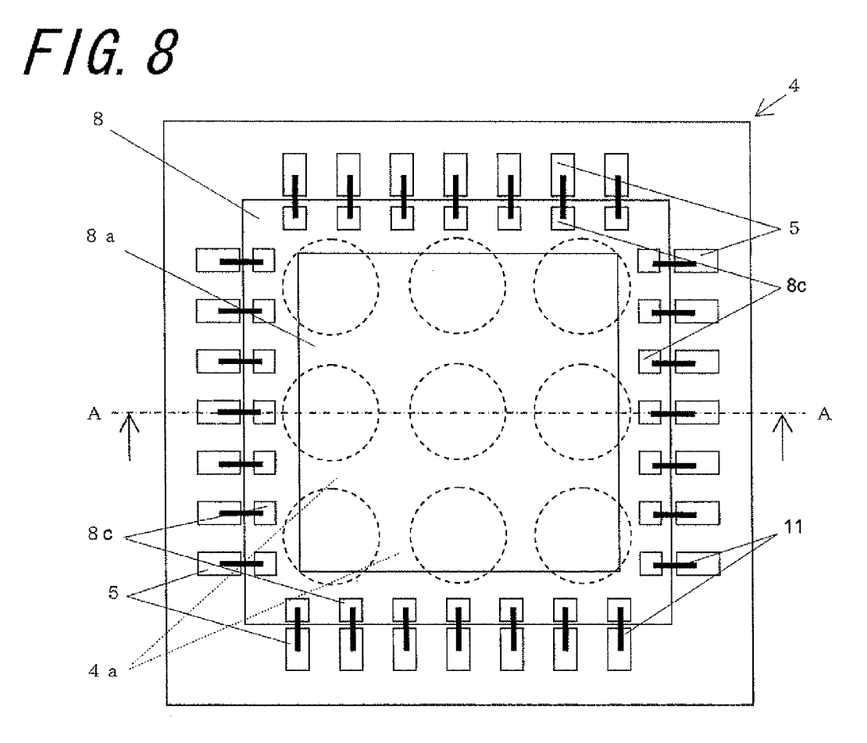
FIG. 8 is a top view showing another example of the imaging device according to the embodiment of the invention, with a lens barrel having a lens removed.
Figure 9:
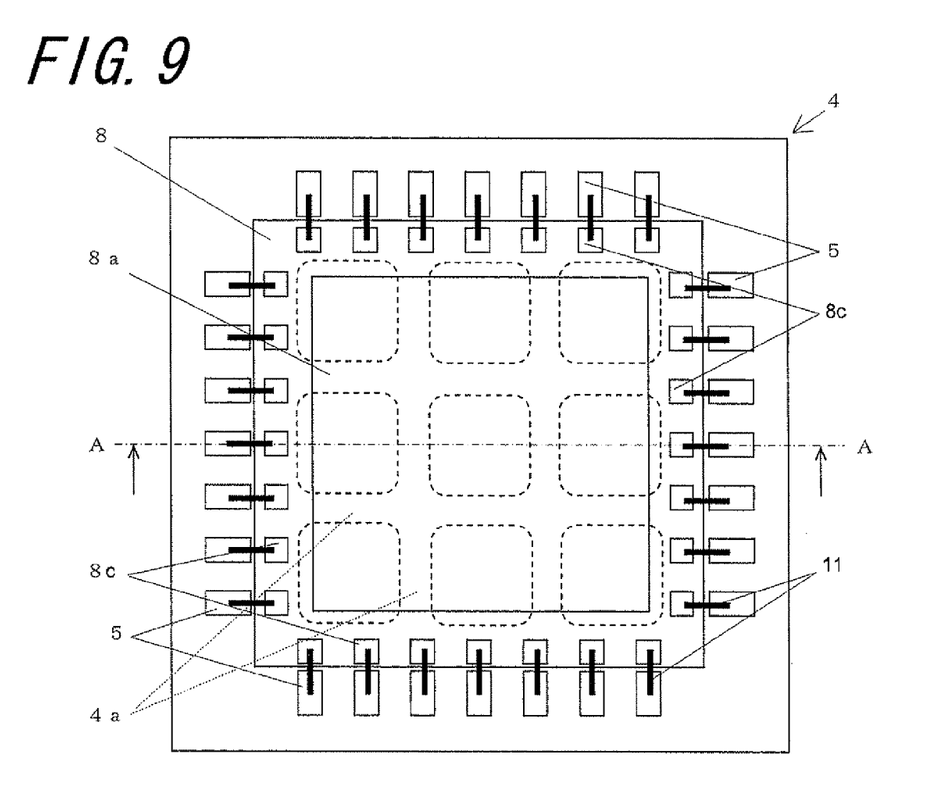
FIG. 9 is a top view showing another example of the imaging device according to the embodiment of the invention, with a lens barrel having a lens removed.

Moreover, as in examples shown in FIGS. 8 and 9, in the imaging device of the invention, it is advisable that a plurality of opening segments obtained by dividing the opening by the wall 4a are each circularly-shaped, elliptically-shaped, or given a polygonal shape with its rounded corners, in, a plan view. In this case, since the opening segment is free of an angle which is susceptible to stress concentration, it is possible to suppress that a crack is developed at the angle and spreads therefrom with consequent breakage of the wall 4a and the frame body 4.

Figure 10:
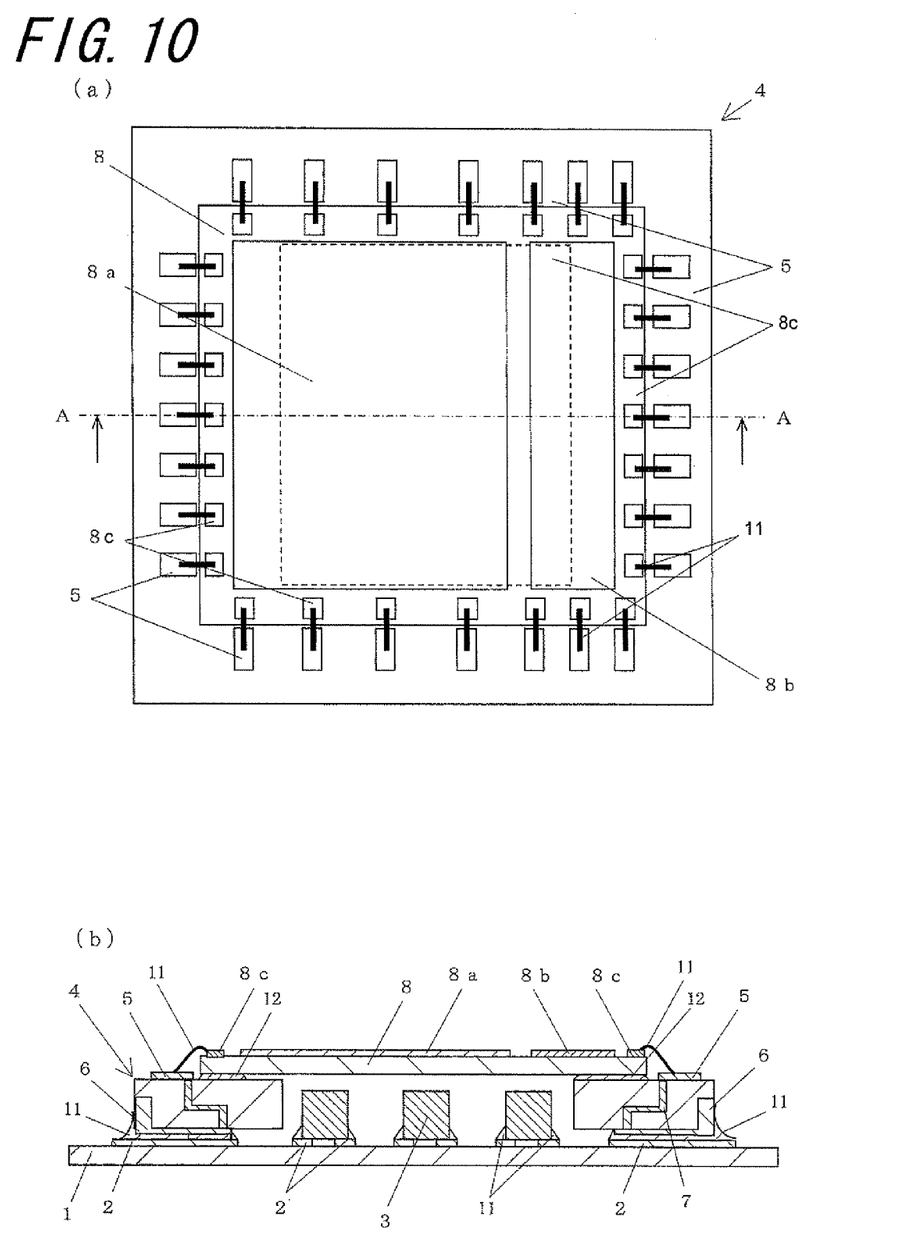
FIG. 10(a) is a top view showing another example of the imaging device according to the embodiment of the invention, with a lens barrel having a lens removed.
FIG. 10(b) is a sectional view taken along the line A-A of FIG. 10(a)

Moreover, as in an example shown in FIG. 10, in the imaging device of the invention, it is advisable that the imaging element 8 has a signal processing circuit 8b which is located on the frame body 4. In this case, heat generated in the signal processing circuit 8b is readily transmitted to the frame body 4, but is hardly transmitted toward the light-receiving section 8a. This makes it possible to suppress heat-induced deformation of the light-receiving section 8a of the imaging element 8.

Figure 11:
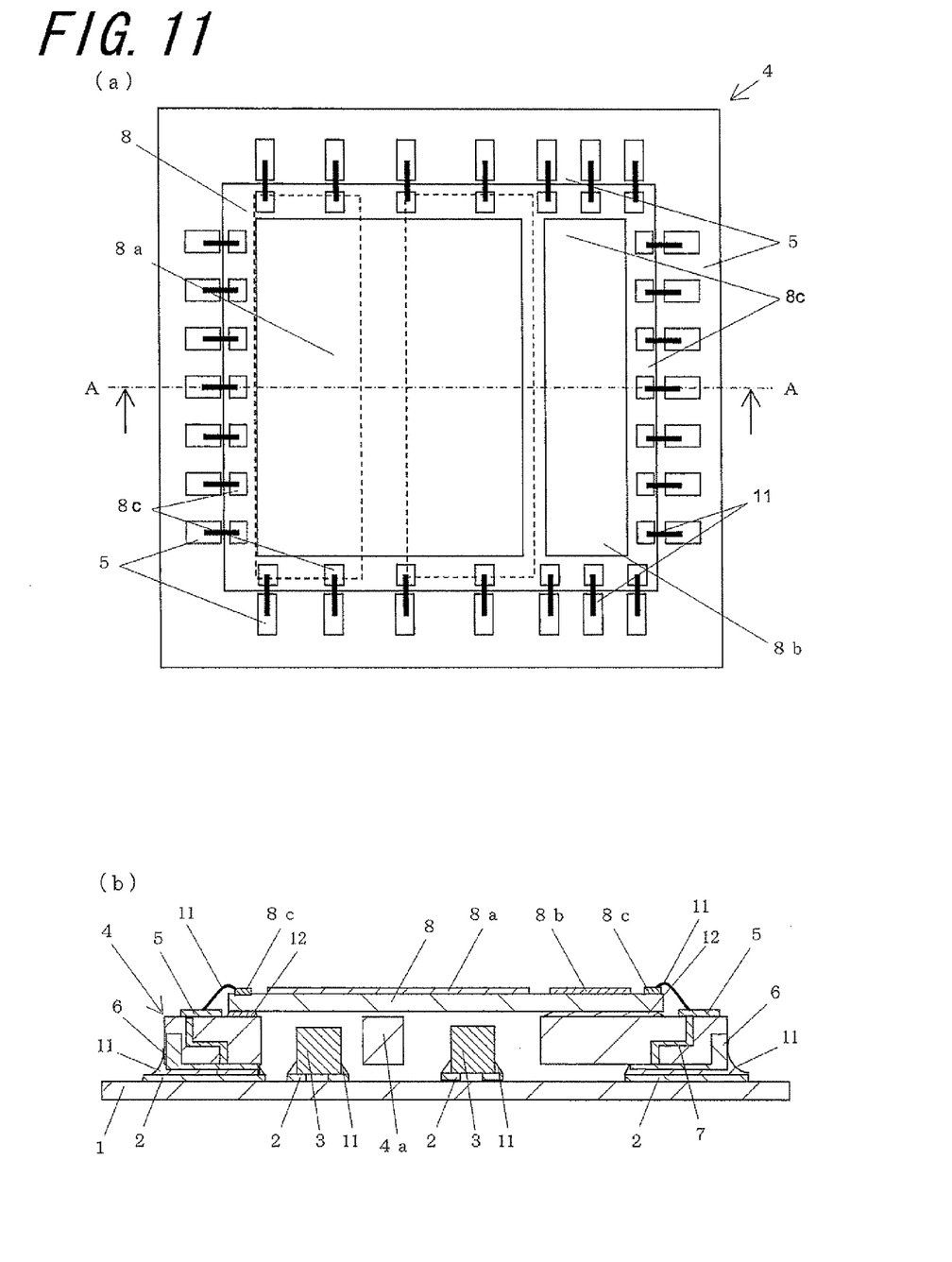
FIG. 11(a) is a top view showing another example of the imaging device according to the embodiment of the invention, with a lens barrel having a lens removed.
FIG. 11(b) is a sectional view taken along the line A-A of FIG. 11(a).

Moreover, as in an example shown in FIG. 11, it is preferable that the signal processing circuit 8b as a whole is situated on the frame body 4 in a plan view. This makes it possible to facilitate transmission of heat generated in the signal processing circuit 8b to the frame body 4, and thereby suppress heat-induced deformation of the light-receiving section 8a more effectively.

As the signal processing circuit 8b, for example, there is provided a DSP (Digital Signal Processor) or the like capable of filtering on signals sent from the imaging element 8 for noise reduction and compensation of optical distortion.

Moreover, as in the examples shown in FIGS. 1 to 11, in the imaging device of the invention, it is advisable that, when the upper surface of the imaging element 8 is seen in a plan view, the electrode 8c of the imaging element 8 is positioned in overlapping relation with the frame body 4, and that electrical connection is established between the electrode 8c of the imaging element 8 and the connection electrode 5 formed on or above the frame body 4 by a bonding wire. In this case, since the frame body 4 is situated below the electrode 8c of the imaging element 8, it is possible to join the bonding wire to the electrode 8c of the imaging element 8 with ease of application of force to the junction.

Moreover, as in the example shown in FIG. 11, in the imaging device of the invention, it is advisable that the light-receiving section 8a of the imaging element 8 is positioned in overlapping relation with the opening of the frame body 4 in a plan view. In this case, since the light-receiving section 8a does not overlap the bonding member 12 in a plan view, it is possible to suppress deformation of the light-receiving section 8a under a stress applied during solidification of the bonding member 12.

The imaging device of the invention is fabricated in the following manner. To begin with, a circuit board 1 as described hereinabove is prepared.

The circuit board 1 is constructed by forming the wiring line 2 on an insulating substrate made of an insulating material such as ceramics or resin. In the case of adopting ceramics as the material for the insulating substrate, examples thereof include aluminum oxide sintered compact (alumina ceramics), aluminum nitride compact, mullite sintered compact, and glass ceramics sintered compact. On the other hand, in the case of adopting resin as the material for the insulating substrate, examples thereof include epoxy resin, polyimide resin, acrylic resin, phenol resin, polyester resin, and fluorine resin typified by tetrafluoroethylene. In addition, a material in which a matrix made of glass fiber is impregnated with resin, such as glass epoxy resin, can also be used.

In the case where the circuit board 1 is made of aluminum oxide sintered compact for example, its fabrication can be accomplished as follows. Firstly, suitable organic solvent and solution medium are admixed in powder of raw material such as alumina ($Al_2O_3$), silica ($SiO_2$), calcia (CaO), and magnesia (MgO) to form a slurry. The slurry is shaped into a sheet-like form by a heretofore known technique such as the doctor blade method or the calender roll method to obtain ceramic green sheets. Subsequently, the plural ceramic green sheets are laminated on top of each other on an as needed basis while being subjected to appropriate punching. The resultant stacked body is fired at a high temperature (in the range of from about 1500° C. to 1800° C.).

On the other hand, in the case where the circuit board 1 is made of resin for example, its fabrication can be accomplished by means of transfer molding, injection molding, or otherwise with use of a mold capable of molding a material into a predetermined shape. Moreover, the fabrication of the circuit board can be accomplished by using a material in which a matrix made of glass fiber is impregnated with resin, such for example as glass epoxy resin. In this case, a glass fiber-made matrix is impregnated with a precursor of epoxy resin, and the resultant epoxy resin precursor is thermally cured at a predetermined temperature.

In the case where the insulating substrate of the circuit board 1 is made of ceramics, the wiring line 2 is made of metallized powder such as tungsten (W), molybdenum (Mo), manganese (Mn), silver (Ag), and copper (Cu). A conductor paste for forming the wiring line 2 is printed in a predetermined configuration onto the ceramic green sheets constituting the insulating substrate of the circuit board 1 by means of screen printing or otherwise. The conductor paste is fired together with the ceramic green sheets, whereby the wiring line 2 can be formed at a predetermined location on the circuit board 1. Out of internal conductors, a through conductor passing through the ceramic green sheets in the thickness direction is formed by filling a through hole formed in the ceramic green sheets with a conductor paste by means of printing. The conductor paste is prepared by kneading powdery metal such as tungsten (W), molybdenum (Mo), manganese (Mn), silver (Ag), and copper (Cu) in addition to suitable solvent and binder, and adjusting the viscosity of the resultant kneaded product to the desired level. In the interest of enhancement in the strength of bonding with the insulating substrate of the circuit board 1, the conductor paste may contain glass or ceramics.

Moreover, in the case where the circuit board 1 is made of resin, the wiring line 2 is made of a metal material such as copper, gold, aluminum, nickel, chromium, molybdenum, titanium, and alloys of those metals. For example, the wiring line 2 is formed by transfer-printing copper foil processed into a form of the wiring line 2 onto a resin sheet made of glass epoxy resin and then laminating the resin sheets bearing the transfer-printed copper foil on top of each other and bonding them with an adhesive. Out of internal conductors, a through conductor passing through the resin sheet in its thickness direction is formed by depositing a conductor paste on the inner surface of a through hole formed in the resin sheet by means of printing or plating, or formed by filling the through hole with the conductor paste. Alternatively, the wiring line 2 may be obtained by forming metal foil or metal column integrally with the resin-made insulating substrate, or obtained by depositing the above material on the insulating substrate of the circuit board 1 by means of sputtering, vapor deposition, plating, or otherwise.

Then, the electronic components 3 including an IC, a capacitor, a coil, a resistor, and so forth for processing electric signals are mounted in connection with the wiring line 2 on the circuit board 1 by the electrically conductive connecting member 11 such for example as solder. The mounting of the electronic component 3 on the circuit board 1 may be conducted after the mounting of the frame body 4 as will hereafter be described on the circuit board 1, or conducted before the mounting of the frame body.

Next, the frame body 4 is prepared for use. The frame body 4 is, just like the insulating substrate of the circuit board 1, made of an insulating material such as ceramics or resin. In the case of adopting ceramics as the material for the frame body 4, examples thereof include aluminum oxide sintered compact (alumina ceramic), aluminum nitride sintered compact, mullite sintered compact, and glass ceramics sintered compact. On the other hand, in the case of adopting resin as the material for the frame body 4, examples thereof include epoxy resin, polyimide resin, acrylic resin, phenol resin, polyester resin, and fluorine resin typified by tetrafluoroethylene. In addition, a material in which a matrix made of glass fiber is impregnated with resin, such as glass epoxy resin, can also be used.

In the case where the frame body 4 is made of aluminum oxide sintered compact for example, its fabrication can be accomplished by using the same material and method as adopted in the fabrication of the circuit board 1. Note that the opening of the frame body 4 can be obtained by forming a through hole acting as the opening in the ceramic green sheets constituting the frame body 4 by means of punching using a die or punch, laser machining, or otherwise, and then performing firing operation. Moreover, as in the examples shown in FIGS. 3 and 4, in the case where the frame body 4 is configured to have a stepped upper surface to provide a shoulder which is lower in level than the top and located toward the opening, the plurality of ceramic green sheets are formed with through holes of different sizes, and these ceramic green sheets are laminated in an arrangement to allow for the formation of a shoulder in a desired shape to thereby form a ceramic green sheet stacked body.

On the other hand, in the case where the frame body 4 is made of resin for example, its fabrication can be accomplished in accordance with the same method as adopted in the fabrication of the circuit board 1.

Figure 5:
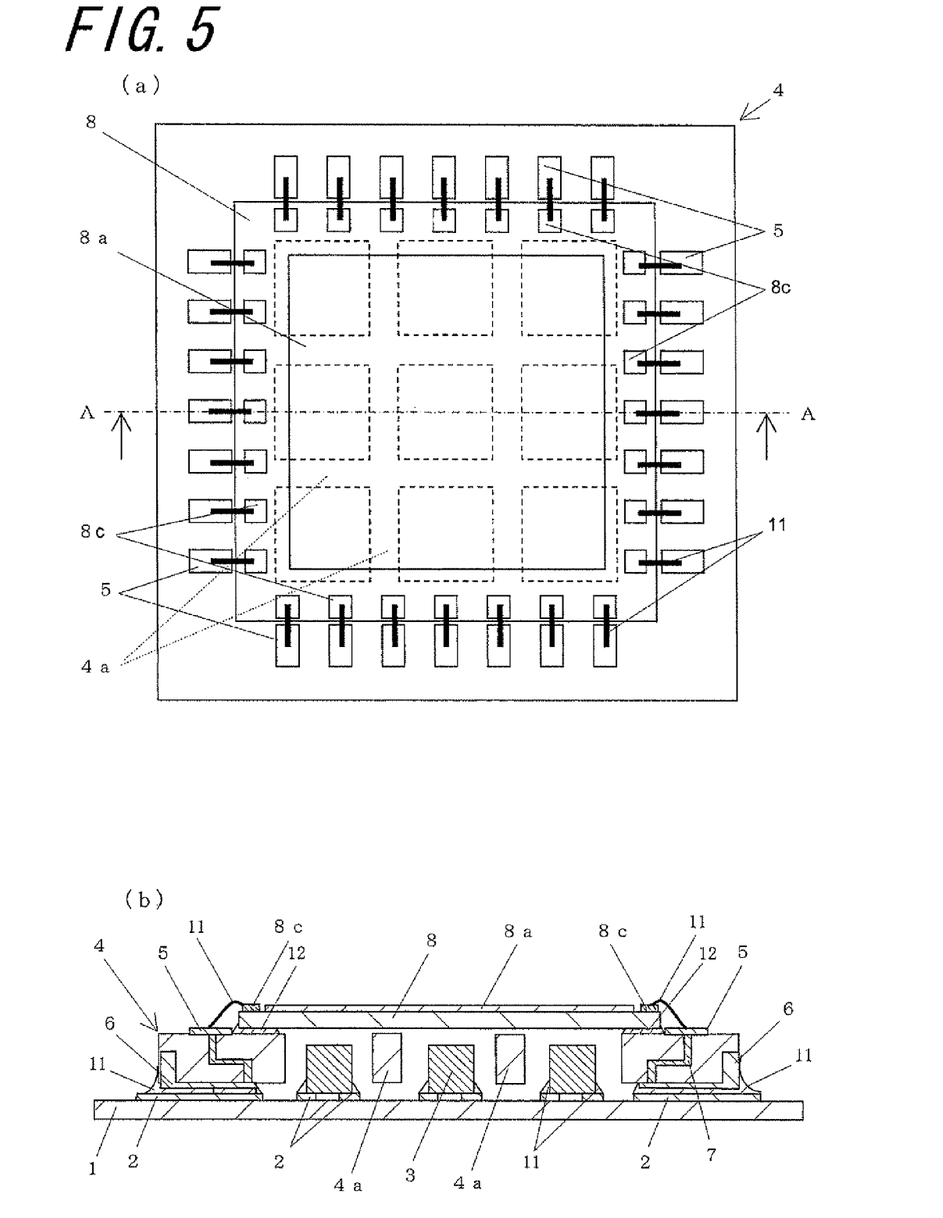
FIG. 5(a) is a top view showing an example of an imaging device according to an embodiment of the invention, with a lens barrel having a lens removed.
FIG. 5(b) is a sectional view taken along the line A-A of FIG. 5(a)
Figure 6:
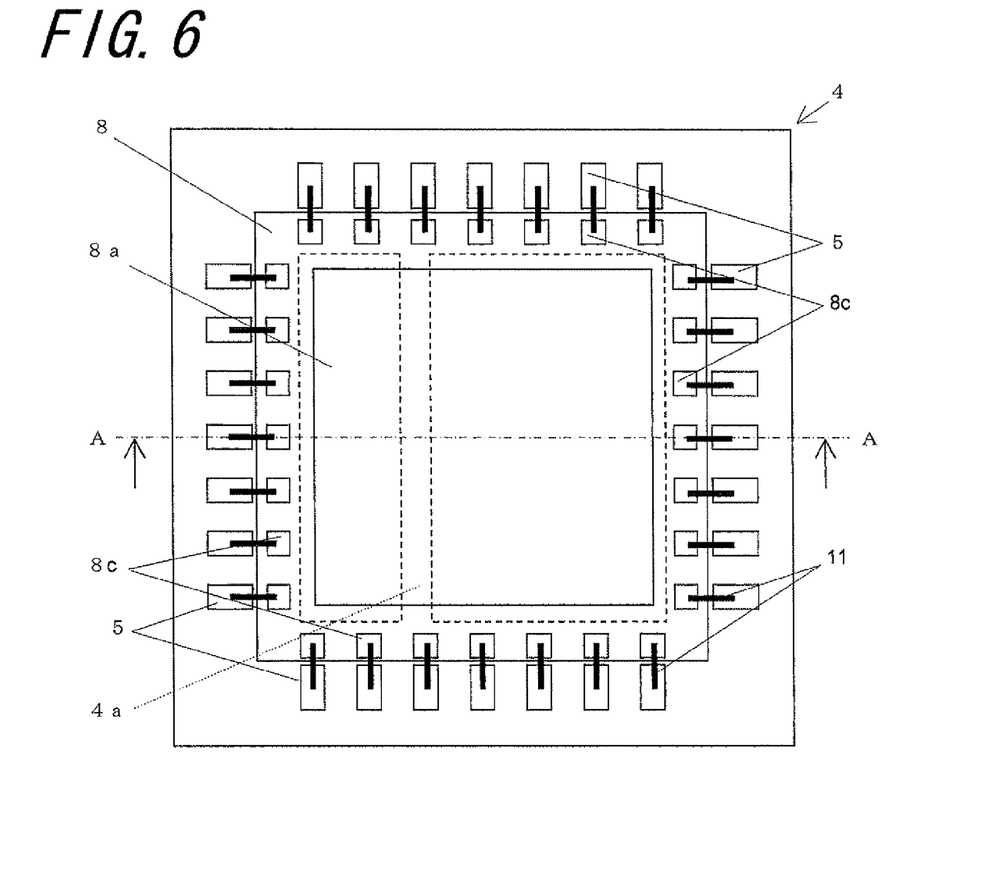
FIG. 6 is a sectional view showing another example of the imaging device according to the embodiment of the invention, with a lens barrel having a lens removed.
Figure 7:
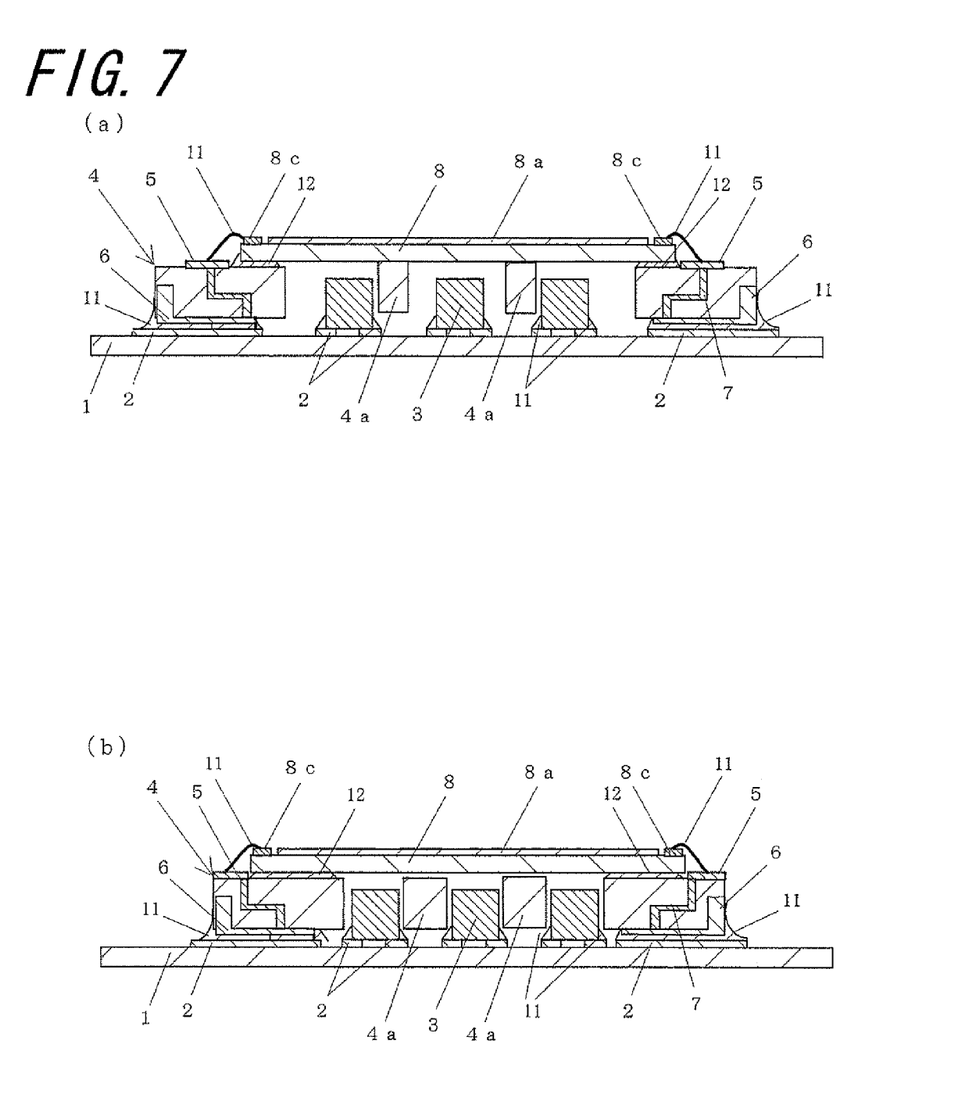
FIG. 7 is a top view showing another example of the imaging device according to the embodiment of the invention, with a lens barrel having a lens removed.

Moreover, in the example shown in FIG. 5, in the case where the frame body 4 is made of ceramics, the wall 4a can be obtained by performing punching on ceramic green sheets with use of an appropriate die, or obtained by forming cutouts in the ceramic green sheets by means of laser or otherwise. In the case where the frame body 4 is composed of stacked ceramic green sheets, the punching operation may be conducted before or after sheet lamination. The advantage of conducting the punching operation after the sheet stacking is that the wall 4a can be formed without any influence of layer-to-layer misregistration in the sheet lamination, and thus the likelihood of development of surface irregularities at the section of the wall 4a can be minimized. Meanwhile, as the thickness of the frame body 4 is increased, deformation of the wall 4a is likely to take place during the punching operation. It is therefore desirable to conduct the punching operation before the sheet lamination. In the case where the wall 4a is made of resin, its formation can be accomplished by using a mold capable of molding a material into a predetermined shape.

Moreover, in the example shown in FIG. 7(a), in the case where the wall 4a is made of ceramics, it is advisable to increase the thickness of the wall 4a by applying a ceramic paste made of the same material as that used for the wall 4a to the upper surface of the wall 4a, or placing a ceramic green sheet having the same shape as that of the wall 4a in a plan view on the upper surface of the wall 4a, so that the upper surface of the wall comes in contact with the lower surface of the imaging element 8. Instead of the aforementioned ceramic paste, a metal paste made of a material having high thermal conductivity may be used, such as tungsten, molybdenum, copper, or the like metal. In this case, heat generated in the imaging element 8 is readily transmitted, through the wall 4a, to the frame body 4. This makes it possible to suppress heat-induced deformation of the light-receiving section 8a of the imaging element 8. Further, in the case of repeating paste application several times, it is possible to use both the metal paste and the ceramic paste.

Moreover, in the example shown in FIG. 7(b), the wall 4a is positioned in non-overlapping relation with the electronic component 3 in a plan view and kept out of contact with the connecting member 11 which connects the side surface of the electronic component 3 with the wiring line 2 on the circuit board 1. In order to obtain such a structure, where the frame body 4 is composed of stacked ceramic green sheets, the lowermost ceramic green sheet of the ceramic green sheet stacked body is subjected to punching so that it corresponds only with the range of the frame body 4. Further, in the case where the wall 4a has a notch formed at its part facing the connecting member 11, the notch can be formed by removing part of the ceramic green sheets by means of laser or otherwise.

Moreover, in the example shown in FIGS. 8 and 9, each of a plurality of opening segments obtained by dividing the opening by the wall 4a has rounded corners. Such an opening segment can be formed by punching operation using an appropriate die, or by making a cutout by means of laser or otherwise.

In the case where the frame body 4 is made of ceramics, the wiring conductor 7, the connection electrode 5, and the external terminal 6 can be formed by using the same material and method as adopted in the formation of the wiring line 2 in the case where the circuit board 1 is made of ceramics. Moreover, the wiring conductor 7 can be formed in three-dimensional configuration within the frame body 4 by a combination of a through conductor and a conductor paste printed on ceramic green sheets on an as needed basis. This makes it possible to arrange the connection electrode 5 and the external terminal 6 in a desired positional relation.

On the other hand, in the case where the frame body 4 is made of resin, the wiring conductor 7, the connection electrode 5, and the external terminal 6 can be formed by using the same material and method as adopted in the formation of the wiring line 2 in the case where the circuit board 1 is made of resin. Also in this case, it is possible to arrange the connection electrode 5 and the external terminal 6 in a desired positional relation by the same technique as adopted in the case where the frame body 4 is made of ceramics.

On exposed surfaces to which the wiring line 2, the connection electrode 5, the external terminal 6, and the wiring conductor 7 are exposed, a plating layer is deposited by a plating technique such as electrolytic plating and electroless plating. The plating layer is made of a metal which excels in corrosion resistance and in connectivity of the connecting member 11, such as nickel and gold. For example, a nickel plating layer having a thickness in a range of about 1 μm to 10 μm and a gold plating layer having a thickness in a range of about 0.1 μm to 3 μm are deposited one after another on the exposed surfaces. This makes it possible to effectively suppress corrosion of the wiring line 2, the connection electrode 5, the external terminal 6, and the wiring conductor 7, as well as to strengthen the connection between the wiring line 2 of the circuit board 1 and the external terminal 6 of the frame body 4, the bonding between the wiring line 2 of the circuit board 1 and the electronic component 3, and the bonding between the connection terminal of the imaging element 8 and the connection electrode 5.

Next, the imaging element 8 of CCD type or CMOS type is located on the upper surface of the frame body 4 so as to cover the opening of the frame body 4, and is fixed to the frame body 4 by the bonding member 12, and electrical connection is established between them by the connecting member 11 so as to electrically connect the connection terminal of the imaging element 8 with the connection electrode 5 of the frame body 4. In the interest of preventing occurrence of electrical short-circuiting between the connection electrodes 7 caused by the flow of the bonding member 12, the bonding member 12 is preferably made of non-conductive resin. However, as in the example shown in FIG. 3, in a case where the stepped surface configuration with a shoulder is provided to render the surface on which the connection electrode 7 is located higher in level than the surface mounting the imaging element 8, solder or electrically conductive resin may be used for the bonding member 12. Moreover, in a case where the imaging element 8 has the connection electrode located on a lower surface thereof, solder bonding, ultrasonic bonding using Au bump, or flip-chip bonding using anisotropic conductive resin may be carried out. In the case of performing flip-chip bonding using solder or Au bump, the bonding of the connection terminal of the imaging element 8 with the connection electrode 5 is strengthened, and the light-receiving section 8a is preferably sealed by filling of an underfill material (not shown) in order to protect the light-receiving section 8a.

Then, the lens barrel 10 having the lens 9 is prepared, and is bonded to the outer periphery of the upper surface of the frame body 4 so as to cover the imaging element 8. According to such a structure, there is obtained the imaging device which is made smaller in size and lower in profile and is capable of producing output of high-quality image signals. The lens 9, which is made of glass, resin such as epoxy resin, or the like, is attached to the lens securing member 12 so as to allow entry of light which has passed through the lens 9 through the opening of the lens securing member 12 on the light-receiving section 8a of the imaging element 8. The lens securing member 12 is made of resin or metal, and is fixed to the upper surface of the frame body 4 by an adhesive such as epoxy resin or solder, or fixed to the frame body 4 by a hook or the like (not shown) provided in the lens securing member 12 in advance, as in the example shown in FIGS. 2 to 4.

The light-transmittable plate 13, which is made of crystal, glass, or resin such as epoxy resin, is bonded to the frame body 4 by an adhesive such as thermosetting- or ultraviolet curable-type epoxy resin or glass. For example, after ultraviolet curable-type epoxy resin is applied to the upper surface of the frame body 4 or the outer edge of the light-transmittable plate 13 by a dispensing technique, the light-transmittable plate 13 is emplaced on the upper surface of the frame body 4. Upon ultraviolet irradiation, the adhesive is cured with consequent achievement of sealing. A filter may be formed on the light-transmittable plate 13.

Exemplary of the filter to be formed on the light-transmittable plate 13 is a low-pass filter composed of a stack of two or three crystal plates of differing crystalline azimuth, which is capable of preventing a moiré phenomenon from occurring in an image taken by the imaging element 8 by exploiting the birefringent characteristics of the crystal plates. In the case of using a crystal plate for the light-transmittable plate 13, the light-transmittable plate 13 serves also as one of the crystal plates constituting the low-pass filter.

Another exemplary of the filter to be formed on the light-transmittable plate 13 is an IR cutoff filter. In general, the imaging element 8 exhibits higher sensitivity to light in a red to infrared region than do human eyes. The IR cutoff filter cuts off light in a red to infrared wavelength range to adapt the imaging element 8 to the color-tone sensitivity of human eyes. The IR cutoff filter can be fabricated by forming several dozens of dielectric multilayer films alternately on the surface of the light-transmittable plate 13. The dielectric multilayer film is customarily formed by alternately laminating several dozens of high-refractive-index dielectric layers made of a dielectric material having a refractive index of 1.7 or more and low-refractive-index dielectric layers made of a dielectric material having a refractive index of 1.6 or less by means of vapor deposition, sputtering, or otherwise. As the dielectric material having a refractive index of 1.7 or more, tantalum pentoxide, titanium oxide, niobium pentoxide, lanthanum oxide, and zirconium oxide are usable. As the dielectric material having a refractive index of 1.6 or less, silicon oxide, aluminum oxide, lanthanum fluoride, and magnesium fluoride are usable.

In the manner as above described, on the circuit board 1 is mounted the imaging device composed for example of the frame body 4 of about 10 mm per side, the electronic component 3 housed in the frame body 4, the imaging element 8 of about 8 mm per side, and the lens barrel 10 having the lens 9 which is located above the imaging element 8, the lens barrel having a height of about 5 to 10 mm.

It should be understood that the application of the invention is not limited to the specific embodiments described heretofore, and that many modifications and variations of the invention are possible within the spirit and scope of the invention. For example, each of the opening segments obtained by dividing the opening by the wall in the examples shown in FIGS. 5, 8, and 9 may be designed in honeycomb configuration. By adopting the honeycomb configuration, it is possible to increase the proportion of opening part per unit area in a plan view while enhancing the strength of the wall 4a, and thereby gain the advantage of being able to impart compactness and high strength to the imaging device.

REFERENCE SIGNS LIST

1: Circuit board 1
2: Wiring line
3: Electronic component
4: Frame body
4a: Wall
5; Connection electrode
6: External terminal
7: Wiring conductor
8: Imaging element
8a: Light-receiving section
8b: Signal processing circuit
8c: Electrode
9: Lens
10: Lens barrel
11: Connecting member
12: Bonding member
13: Light-transmittable plate

The invention claimed is:

1. An imaging device, comprising:
a circuit board having a wiring line formed as part of an upper surface thereof;
an electronic component mounted on the circuit board;
a frame body mounted on the circuit board so as to surround the electronic component, the frame body having a plurality of connection electrodes formed on or above an upper surface thereof and a plurality of external terminals formed on or above at least one of a side surface and a lower surface thereof which are electrically connected to the connection electrodes;
an imaging element having a light-receiving section located in a central portion of an upper surface thereof, the imaging element being mounted on the upper surface of the frame body so as to cover an opening of the frame body; and
a lens barrel having a lens, the lens barrel being bonded to an outer periphery of the upper surface of the frame body so as to cover the imaging element,
the imaging element having a signal processing circuit which is located on the frame body.

2. The imaging device according to claim 1, further comprising:
a wall that passes over a mid-portion of the opening of the frame body and divides the opening in a plan view.

3. The imaging device according to claim 2, wherein an upper surface of the wall comes in contact with a lower surface of the imaging element.

4. The imaging device according to claim 2, wherein the wall is positioned in non-overlapping relation with the electronic component in a plan view and kept out of contact with a connecting member which connects a side surface of the electronic component with the wiring line formed as part of an upper surface of the circuit board.

5. The imaging device according to claim 2, wherein a plurality of opening segments obtained by dividing the opening by the wall are each circularly-shaped or given a polygonal shape with rounded corners in a plan view.

6. An imaging device, comprising:
a circuit board having a wiring line formed as part of an upper surface thereof;
an electronic component mounted on the circuit board;
a frame body mounted on the circuit board so as to surround the electronic component, the frame body having a plurality of connection electrodes formed on or above an upper surface thereof and a plurality of external terminals formed on or above at least one of a side surface and a lower surface thereof which are electrically connected to the connection electrodes;
an imaging element having a light-receiving section located in a central portion of an upper surface thereof, the imaging element being mounted on the upper surface of the frame body so as to cover an opening of the frame body; and
a lens barrel having a lens, the lens barrel being bonded to an outer periphery of the upper surface of the frame body so as to cover the imaging element,
when the upper surface of the imaging element is seen in a plan view, an electrode of the imaging element being positioned in overlapping relation with the frame body, and electrical connection being established between the electrode of the imaging element and the connection electrode formed on or above the frame body by a bonding wire.

7. The imaging device according to claim 6, further comprising:
a wall that passes over a mid-portion of the opening of the frame body and divides the opening in a plan view.

8. The imaging device according to claim 7, wherein an upper surface of the wall comes in contact with a lower surface of the imaging element.

9. The imaging device according to claim 7, wherein the wall is positioned in non-overlapping relation with the electronic component in a plan view and kept out of contact with a connecting member which connects a side surface of the electronic component with the wiring line formed as part of an upper surface of the circuit board.

10. The imaging device according to claim 7, wherein a plurality of opening segments obtained by dividing the opening by the wall are each circularly-shaped or given a polygonal shape with rounded corners in a plan view.

11. An imaging device, comprising:
a circuit board having a wiring line formed as part of an upper surface thereof;
an electronic component mounted on the circuit board;
a frame body mounted on the circuit board so as to surround the electronic component, the frame body having a plurality of connection electrodes formed on or above an upper surface thereof and a plurality of external terminals formed on or above at least one of a side surface and a lower surface thereof which are electrically connected to the connection electrodes;
an imaging element having a light-receiving section located in a central portion of an upper surface thereof, the imaging element being mounted on the upper surface of the frame body so as to cover an opening of the frame body; and
a lens barrel having a lens, the lens barrel being bonded to an outer periphery of the upper surface of the frame body so as to cover the imaging element,
the light-receiving section of the imaging element being positioned in overlapping relation with the opening of the frame body in a plan view.

12. The imaging device according to claim 11, further comprising:
a wall that passes over a mid-portion of the opening of the frame body and divides the opening in a plan view.

13. The imaging device according to claim 12, wherein an upper surface of the wall comes in contact with a lower surface of the imaging element.

14. The imaging device according to claim 12, wherein the wall is positioned in non-overlapping relation with the electronic component in a plan view and kept out of contact with a connecting member which connects a side surface of the electronic component with the wiring line formed as part of an upper surface of the circuit board.

15. The imaging device according to claim 12, wherein a plurality of opening segments obtained by dividing the opening by the wall are each circularly-shaped or given a polygonal shape with rounded corners in a plan view.

* * * * *